(12) United States Patent
Manley et al.

(10) Patent No.: US 11,329,228 B2
(45) Date of Patent: May 10, 2022

(54) POLAR ELASTOMER MICROSTRUCTURES AND METHODS FOR FABRICATING SAME

(71) Applicant: CORNING INCORPORATED, Corning, NY (US)

(72) Inventors: Robert George Manley, Vestal, NY (US); Karan Mehrotra, Painted Post, NY (US); Barry James Paddock, Horseheads, NY (US); Rajesh Vaddi, Corning, NY (US); Nikolay Zhelev Zhelev, Painted Post, NY (US); Bin Zhu, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 161 days.

(21) Appl. No.: 16/471,446

(22) PCT Filed: Dec. 19, 2017

(86) PCT No.: PCT/US2017/067261
§ 371 (c)(1),
(2) Date: Jun. 19, 2019

(87) PCT Pub. No.: WO2018/118890
PCT Pub. Date: Jun. 28, 2018

(65) Prior Publication Data
US 2021/0135114 A1    May 6, 2021

Related U.S. Application Data

(60) Provisional application No. 62/528,639, filed on Jul. 5, 2017, provisional application No. 62/436,100, filed on Dec. 19, 2016.

(51) Int. Cl.
*H01L 51/00* (2006.01)
*G03F 7/20* (2006.01)
(Continued)

(52) U.S. Cl.
CPC ............ *H01L 51/0018* (2013.01); *G03F 7/70* (2013.01); *H01L 51/004* (2013.01);
(Continued)

(58) Field of Classification Search
CPC ............... H01L 51/0018; H01L 51/004; H01L 51/0043; H01L 51/0023
See application file for complete search history.

(56) References Cited

U.S. PATENT DOCUMENTS 6,294,257 B1   9/2001   Tsukakoshi et al.
9,954,191 B2   4/2018   Bao et al.
(Continued)

FOREIGN PATENT DOCUMENTS

EP    2960280 A1    12/2015
JP    2004-108136 A    4/2004
(Continued)

OTHER PUBLICATIONS

Ataollahi et al; "Preparation and Characterization of PVDF-HFP/MG49 Based Polymer Blend Electrolyte"; Int. J. Electrochem. Sci., 7 (2012) pp. 6693-6703.
Guo et al; "Ferroelectric Polymer Nanostructures: Fabrication, Structural Characteristics and Performance Under Confinement"; Journal of Nanoscience and Nanotechnoloyg; vol. 14, pp. 2086-2100; 2014.
(Continued)

*Primary Examiner* — Anthony Ho

(57) ABSTRACT

A method of fabricating microstructures of polar elastomers includes coating a substrate with a dielectric material including a polar elastomer, coating the dielectric material with a photoresist, exposing the photoresist to ultraviolet (UV) light through a photomask to define a pattern on the photoresist, developing the photoresist to form the pattern on the photoresist, etching the dielectric material to transfer the pattern from the photoresist to the dielectric material, and removing the photoresist from the patterned dielectric material.

10 Claims, 5 Drawing Sheets

(51) Int. Cl.
*H01L 51/05* (2006.01)
*G03F 7/40* (2006.01)
(52) U.S. Cl.
CPC ...... *H01L 51/0023* (2013.01); *H01L 51/0043* (2013.01); *H01L 51/0558* (2013.01); *G03F 7/40* (2013.01)

(56) References Cited

U.S. PATENT DOCUMENTS

| | | |
|---|---|---|
| 10,026,911 B2 | 7/2018 | Enicks et al. |
| 2003/0001151 A1 | 1/2003 | Li et al. |
| 2017/0192354 A1 | 7/2017 | Zhao et al. |

FOREIGN PATENT DOCUMENTS

| | | |
|---|---|---|
| JP | 2010264199 A | 11/2010 |
| WO | 2014026342 A1 | 2/2014 |
| WO | 2016/003523 A2 | 1/2016 |

OTHER PUBLICATIONS

Honeywell; "Spin/Bake/Cure Procedure for Spin-on-Glass Materials: for Interlevel and Intermetal Dielectric Planarization"; Application Note No. 1; 2000; 12 Pages.

International Search Report and Written Opinion of the International Searching Authority; PCT/US2017/067261; dated Jun. 11, 2018; 16 Pages; European Patent Office.

Invitation to Pay Additional Fees of the International Searching Authority; PCT/US2017/067261; dated Apr. 11, 2018; 9 Pages; European Patent Office.

Matthews et al; "Scalable Synthesis of Fused Thiophene-Diketopyrrolopyrrol Semiconducting Polymers Processed From Nonchlorinated Solvents Into High Performance Thin Film Transistors"; Chem. Mater. 2013, 25, pp. 782-789.

Wang et al; "Significance of the Double-Layer Capacitor Effect in Polar Rubbery Dielectrics and Execeptionally Stable Low-Voltage High Transconductance Organic Transistors." Nature Scientific Reports; 5:17849, 2015, 8 Pages.

International Search Report and Written Opinion of the International Searching Authority; PCT/US2017/067249; dated Apr. 11, 2018; 14 Pages; European Patent Office.

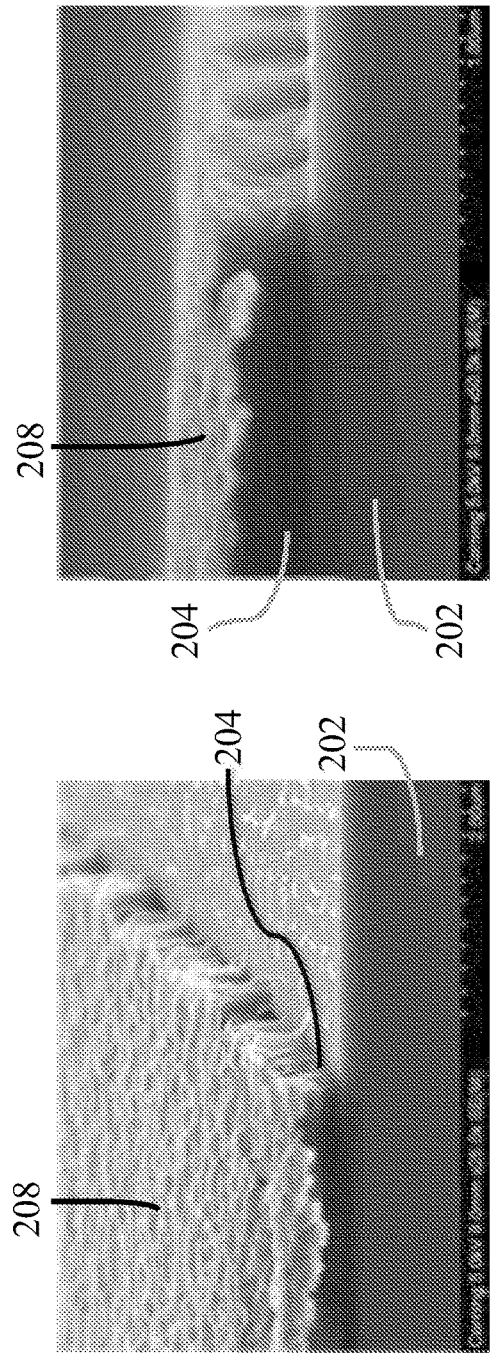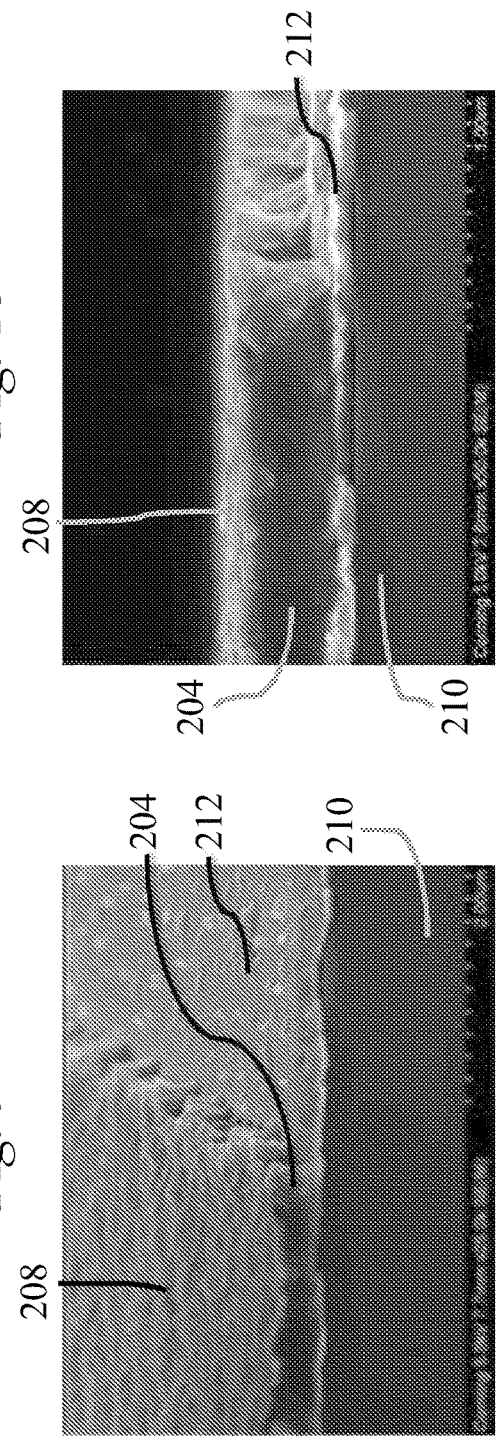

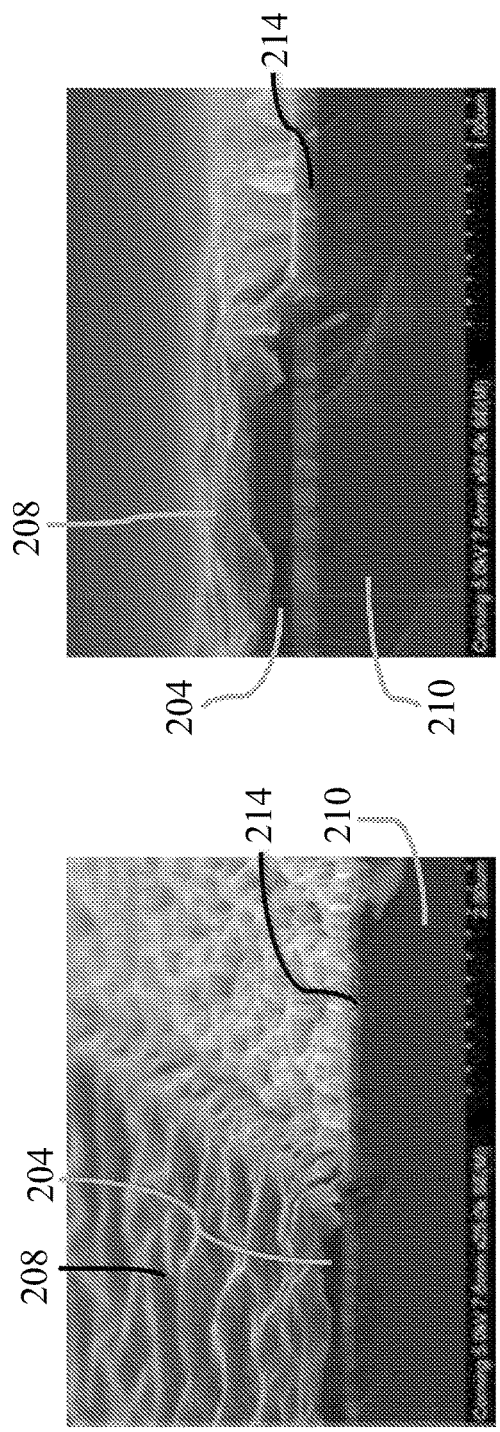
Fig. 14
Fig. 13
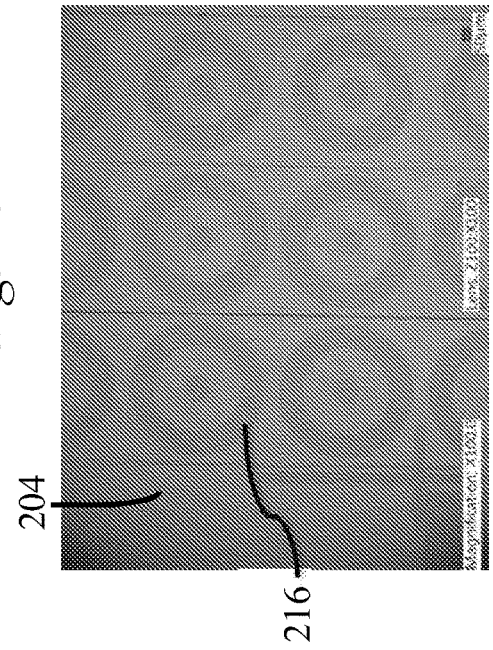
Fig. 16
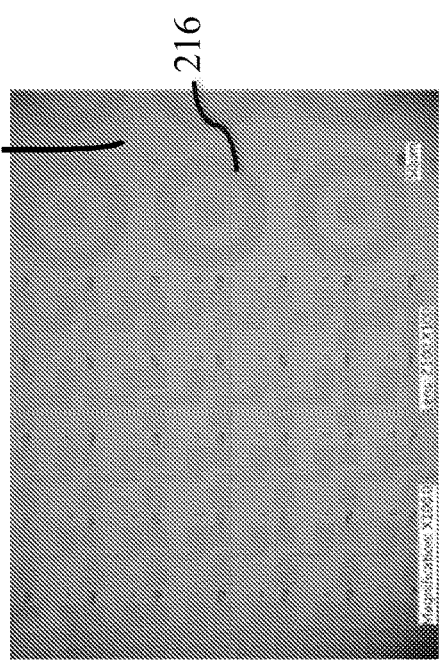
Fig. 15

POLAR ELASTOMER MICROSTRUCTURES AND METHODS FOR FABRICATING SAME

CROSS REFERENCE TO RELATED APPLICATIONS

This application claims the benefit of priority under 35 U.S.C. § 371 of International Application No. PCT/US17/67261, filed on Dec. 19, 2017, which claims the benefit of priority under 35 U.S.C. § 119 of U.S. Provisional Application Ser. No. 62/528,639, filed on Jul. 5, 2017, and U.S. Provisional Application Ser. No. 62/436,100, filed on Dec. 19, 2016, the contents of all of which are relied upon and incorporated herein by reference in their entirety.

BACKGROUND

Transistors are the fundamental building block in modern circuitry, and are used as either signal amplifiers or on/off switches. One type of transistor is a field effect transistor. The field effect is a phenomenon in which the conductivity of a semiconductor changes due to the application of an electric field normal to its surface. The electric field is applied via a metallic gate in the device.

An organic field-effect transistor (OFET) is a field-effect transistor that uses an organic semiconductor in its channel. These devices have been used to realize low-cost, large-area electronic products and biodegradable electronics. The interest in OFETs has grown enormously in the past ten years. The reasons for this surge of interest are manifold. The performance of OFETs have improved significantly. As a result, there is now greater industrial interest in using OFETs for applications that are currently incompatible with the use of a-Si or other inorganic transistor technologies. One of their main technological attractions is that all the layers of an OFET can be deposited and patterned at room temperature, which makes them ideally suited for realizing low-cost, large-area electronic functions on flexible substrates.

Although they hold tremendous potential, it has been challenging to produce OFETs that have high transconductance. This is difficult to achieve with organic materials due to their relatively low charge carrier mobilities. One way to produce high transconductance is using dielectric layers having high capacitances. Recent research has shown that polar elastomers can be used to make high capacitance dielectric layers, especially polar elastomers that exhibit a double-layer capacitance effect such as poly(vinylidene fluoride-cohexafluoropropylene)(e-PVDF-HFP).

The polar elastomer dielectric layers formed to date have not been patterned. The dielectric layer covered the entire surface of the doped silicon substrate. This design only works if the substrate is electrically conductive so it can function as the gate electrode. Otherwise, no access to the electrodes is available. It would be desirable to pattern the polar elastomer dielectric layer for those applications that use a non-conductive substrate and/or require large surface integration—e.g. organic thin film transistors (OTFTs) used in LCD and/or OLED displays.

SUMMARY

Polar elastomers can be patterned and etched using photoresist masks and optical lithography. Conductive electrodes can also be deposited and patterned on the surface of the polar elastomers preferably without the use of shadow masking. The polar elastomers can also be patterned and etched using hard masking material such as the patterned metal electrodes.

The methods provide a number of advantages. One advantage is that they can be used to fabricate spatially isolated thin film transistor structures and gate dielectrics. Another advantage is that they can be used to make vias in the polar elastomer dielectric layer to access electrically conductive contacts underneath.

Another advantage is that the methods are compatible with the current manufacturing infrastructure and processes. For example, the methods can be implemented using proven photoresist masking techniques and materials. Also, the methods allow the polar elastomer material to be integrated into the existing thin film electronics manufacturing infrastructure.

The Summary is provided to introduce a selection of concepts in a simplified form that are further described below in the Detailed Description. The Summary and the Background are not intended to identify key concepts or essential aspects of the disclosed subject matter, nor should they be used to constrict or limit the scope of the claims. For example, the scope of the claims should not be limited based on whether the recited subject matter includes any or all aspects noted in the Summary and/or addresses any of the issues noted in the Background.

DRAWINGS

The preferred and other embodiments are disclosed in association with the accompanying drawings in which:

FIGS. 9-10 are SEM images of a cross-section of a silicon wafer coated with a polar elastomer (e-PVDF-HFP) that was etched using a metal mask and oxygen plasma.

FIGS. 11-12 are SEM images of a cross-section of a polar elastomer (e-PVDF-HFP) on a metal coated glass substrate where the polar elastomer was etched using a metal mask and oxygen plasma.

FIGS. 13-14 are SEM images of a cross-section of a polar elastomer (e-PVDF-HFP) on a metal coated glass substrate where the polar elastomer was etched using a metal mask and tetrafluoromethane plasma.

FIGS. 15-16 are SEM images of metal microstructures patterned on the surface of a polar elastomer (e-PVDF-HFP) layer.

DETAILED DESCRIPTION

Methods are disclosed for forming polar elastomer microstructures on a substrate and/or forming metal microstructures on a polar elastomer dielectric layer. Microstructures made of these materials are also disclosed. The methods and corresponding microstructures can form at least part of one or more organic field effect transistors (OFETs). OFETs generally include three electrodes or terminals, the source, drain, and gate, as well as an organic semiconductor layer and an insulating or dielectric layer positioned between the organic semiconductor and the gate electrode. These components can be configured in a variety of ways to product different types of OFETs.

Figure 1:
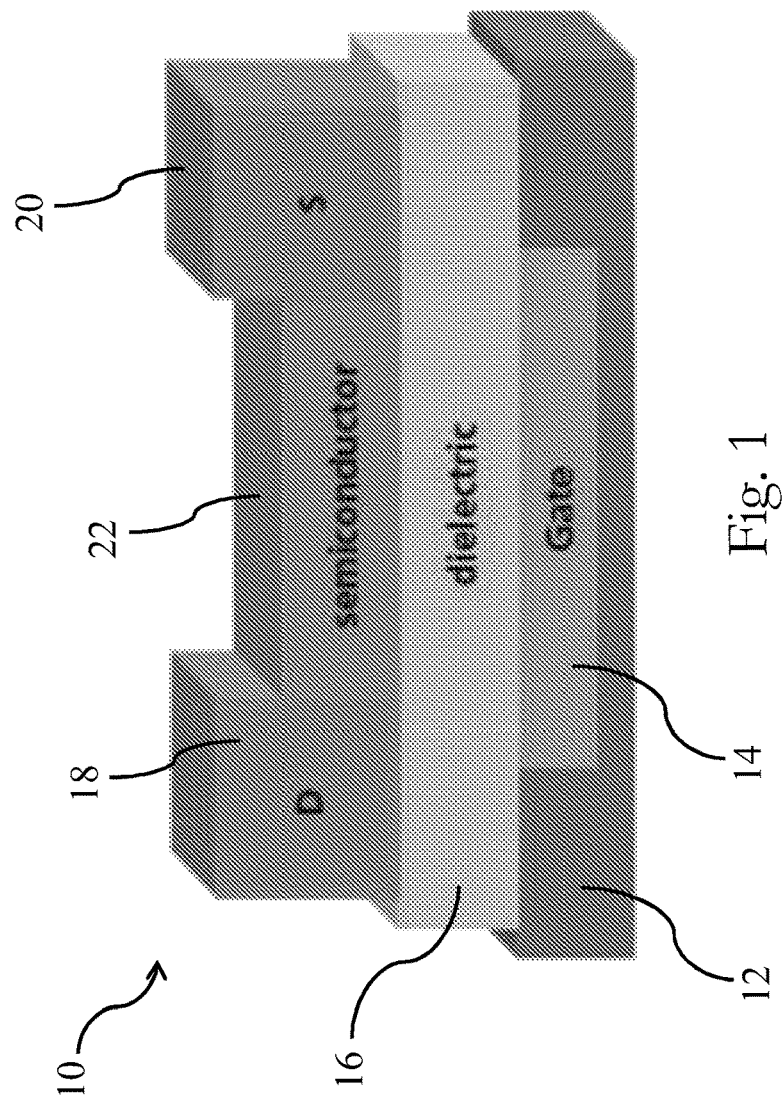
FIG. 1 shows one embodiment of an organic field effect transistor.

FIG. 1 shows one example of an OFET 10 that is configured as an organic thin film transistor (OTFT). The OFET includes a base layer or substrate 12, a gate electrode 14, a dielectric layer 16, a drain electrode 18, a source electrode 20, and an organic semiconductor 22. The gate electrode 14 is positioned in a recess in the base layer 12. The dielectric layer 16 is positioned on top of the base layer 12 and the gate electrode 14. The drain and source electrodes 18, 20 are positioned on top of the dielectric layer 16 on the left and right sides, respectively. The organic semiconductor layer 22 is positioned on top of the dielectric layer 16 between the drain and source electrodes 18, 20.

It should be appreciated that FIG. 1 is only one example of an OFET that can be made using the disclosed methods and/or corresponding microstructures. Numerous other configurations can also be made including those used with organic light emitting devices (OLEDs) such as AMOLED displays and the like.

The OFET operates as follows. A voltage is applied to the gate 14 to control the amount of current flow between the source 20 and the drain 18. In a p-type OFET, a negative voltage greater in magnitude than the threshold voltage of the semiconductor material 22 is applied between the gate 14 and the source 20. This voltage causes a p-type channel to form at the semiconductor-insulator interface. A negative voltage is also applied between the drain 18 and the source 20, causing holes to flow from the source 20 to the drain 18. This behavior is equivalent to a negative current flowing from the drain 18 to the source 20. In the case of an n-type OFET, the current-voltage behavior is similar, but the electrons and holes have the opposite charge.

The OFET 10 can be made of any suitable material. For example, the base layer 12 can be made of silicon, glass ceramic, or glass. The electrodes 14, 18, 20 can also be any suitable material and have any suitable configuration. In general, for an OFET to function properly, charge injection from the electrode should to be efficient. This means the work function of the electrode should match well with the energy level of the organic semiconductor such that the energy barrier for charge injection is low. Suitable materials that can be used as the electrodes include Au, Pd, indium tin oxide, and the like. Solution processable electrode materials are desirable to facilitate low cost production.

Organic Semiconductors

The organic semiconductor 22 can include any suitable material. It can be a polymer and/or a non-polymer. It can also be a p-type semiconductor or an n-type semiconductor. In one embodiment, the organic semiconductor 22 includes a fused thiophene based semiconducting polymer such as, for example, a fused thiophene diketopyrrolopyrrole semiconducting polymer having the following structure:

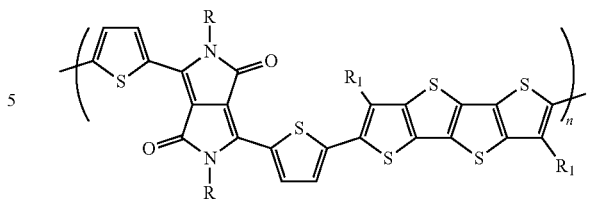

wherein R and $R_1$ are, independently, hydrogen or alkyl (e.g., $C_1$-$C_{30}$ alkyl). In one embodiment, the fused thiophene diketopyrrolopyrrole semiconducting polymer includes poly(tetrathienoacene-diketopyrrolopyrrole) (PTDPPTFT4) having the following structure:

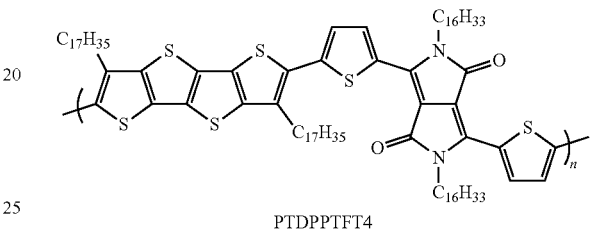

PTDPPTFT4

It should be appreciated that numerous other organic semiconductors 22 can be used. For example, the organic semiconductor 22 can include graphene. The organic semiconductor 22 can also include an n-type organic semiconductor polymer such as: poly(benzimidazobenzophenanthroline); poly[(2,5-didecyloxy-1,4-phenylene) (2,4,6-triisopropylphenylborane)], diphenyl terminated; poly(2,5-di(3,7-dimethyloctyloxy)cyanoterephthalylidene); poly(2,5-di(hexyloxy)cyanoterephthalylidene); poly(5-(3,7-dimethyloctyloxy)-2-methoxy-cyanoterephthalylidene); and/or poly(2,5-di(octyloxy)cyanoterephthalylidene), Poly(5-(2-ethylhexyloxy)-2-methoxy-cyanoterephthalylidene).

The organic semiconductor 22 can also include a non-polymer n-type organic semiconductor such as: bisbenzimidazo[2,1-a:2',1'-a']anthra[2,1,9-def:6,5,10-d'e'f']diisoquinoline-10,21-dione; 2,9-bis[2-(4-chlorophenyl)ethyl]anthra[2,1,9-def:6,5,10-d'e'f']diisoquinoline-1,3,8,10(2H,9H)tetrone; N,N'-bis(2,5-di-tert-butylphenyl)-3,4,9,10-perylenedicarboximide; 2,9-bis[2-(4-fluorophenyl)ethyl]anthra[2,1,9-def:6,5,10-d'e'f']diisoquinoline-1,3,8,10(2H,9H)tetrone; 2,9-bis[(4-methoxyphenyl)methyl]anthra[2,1,9-def:6,5,10-d'e'f']diisoquinoline-1,3,8,10(2H,9H)tetrone; 6,12-bis(2,3,4,5,6-pentafluorophenyl)indeno[1,2-b]fluorene; N,N'-bis(3-pentyl)perylene-3,4,9,10-bis(dicarboximide); 5,5'''-bis(tridecafluorohexyl)-2,2': 5',2'':5'',2'''-quaterthiophene; 2,2'-bis[4-(trifluoromethyl)phenyl]-5,5'-bithiazole; 6,12-bis(2,4,6-trimethylphenyl)indeno[1,2-b]fluorene; copper(II) 1,2,3,4,8,9,10,11,15,16,17,18,22,23,24,25-hexadecafluoro-29H,31H-phthalocyanine; DBP; 1,7-dibromo-3,4,9,10-tetracarboxylic acid dianhydride; 2,9-diheptylanthra[2,1,9-def:6,5,10-d'e'f']diisoquinoline-1,3,8,10(2H,9H)tetrone; 2,9-dihexylanthra[2,1,9-def]6,5,10-d'e'f']diisoquinoline-1,3,8,10(2H,9H)tetrone; 2,7-dihexylbenzo[lmn][3,8]phenanthroline-1,3,6,8(2H, 7H)-tetrone; 4-(2,3-dihydro-1,3-dimethyl-1H-benzimidazol-2-yl)-N,N-dimethylbenzenamine; 4-(1,3-dimethyl-2,3-dihydro-1H-benzoimidazol-2-yl)-N,N-diphenylaniline; N, N'-dimethyl-3,4,9,10-perylenedicarboximide; N,N'-dioctyl-3,4,9,10-perylenedicarboximide; N,N'-dipentyl-3,4,9,10-perylenedicarboximide; [6.6]diphenyl $C_{62}$ bis(butyric acid methyl ester)(mixture of isomers); N,N'-diphenyl-3,4,9,10-perylenedicarboximide; 2,9-dipropylanthra[2,1,9-def 6,5,10-d'e'f']diisoquinoline-1,3,8,10(2H,9H)tetrone; N,N'-ditridecylperylene-3,4,9,10-tetracarboxylic diimide; [5,6]-fullerene-$C_{70}$ (95% to >99%); fullerene-$C_{60}$; fullerene-$C_{84}$; ICBA (99%-99.9%); ICMA; indeno[1,2-b]fluorene-6,12-dione; 1,4,5,8-naphthalenetetracarboxylic dianhydride; 1,2,3,4,5,6,7,8-octafluoro-9,10-bis[4-(trifluoromethyl)phenyl]anthracene; 1,2,3,4,5,6,7,8-octafluoro-9,10-bis[2-(2,4,6-trimethylphenyl)ethynyl]anthracene; perylene-3,4,9,10-tetracarboxylic dianhydride; [6,6]-phenyl-$C_{61}$ butyric acid butyl ester (97%-99.9%); [6,6]-phenyl $C_{71}$ butyric acid methyl ester (mixture of isomers); [6,6]-phenyl-$C_{61}$ butyric acid octyl ester; 7,7,8,8-tetracyanoquinodimethane; 2,3,5,6-tetrafluoro-7,7,8,8-tetracyanoquinodimethane; 5,10,15,20-tetrakis(pentafluorophenyl)-21H,23H-porphine palladium (II); 1,3,8,10(2H,9H)-tetraone, 2,9-bis(2-phenylethyl)anthra[2,1,9-def 6,5,10-d'e'f']diisoquinoline; 1,3,6,8(2H,7H)-tetraone, 2,7-dicyclohexylbenzo[lmn][3,8]phenanthroline; and/or [6,6]-thienyl $C_{61}$ butyric acid methyl ester.

The organic semiconductor 22 can also include a p-type organic semiconductor polymer such as: F8BT (e.g., average $M_n$ 17,000-23,000); F8T2; MDMO-PPV; MEH-PPV (e.g., average $M_n$ 40,000-250,000); PBDTBO-TPDO; PBDT (EH)-TPD(Oct); PBDT-TPD (e.g., average $M_n$ 10,000-50,000); PBDTTT-CF; PBTTPD; PBTTT-C14; PCDTBT; PCPDTBT (e.g., average $M_w$ 7,000-20,000); PDTSTPD; PFO-DBT (e.g., average $M_w$ 10,000-50,000); poly([2,6'-4,8-di(5-ethylhexylthienyl)benzo[1,2-b; 3,3-b]dithiophene]{3-fluoro-2 [(2-ethylhexyl)carbonyl]thieno[3,4-b]thiophenediyl}); poly(3-dodecylthiophene-2,5-diyl) (regioregular, regiorandom, and/or electronic grade, e.g., average $M_w$ 15,000-80,000); poly(3-hexylthiophene-2,5-diyl) (regiorandom, regioregular, and/or electronic grade, e.g., average $M_w$ 15,000-75,000); poly(3-octylthiophene-2,5-diyl) (regioregular, regiorandom, and/or electronic grade, e.g., average $M_w$ 20,000-30,000); PSiF-DBT; PTAA (a poly (triaryl amine) semiconductor); PTB7 (e.g., average $M_w$ 80,000-200,000; PDI≤3.0); and/or TQ1.

The organic semiconductor 22 can also include a non-polymer p-type organic semiconductor such as: ADT; benz[b]anthracene; benz[b]anthracene (98%-99%); 2,4-bis[4-(N,N-dibenzylamino)-2,6-dihydroxyphenyl]squaraine; 5,5"-bis (2"",2""-dicyanovinyl)-2,2': 5',2": 5",2"': 5"', 2"''-quinquethiophene (DCVST); 2,4-bis[4-(N,N-diisobutylamino)-2,6-dihydroxyphenyl]squaraine; 2,4-bis[4-(N,N-diphenylamino)-2,6-dihydroxyphenyl]squaraine; bis(ethylenedithio)tetrathiafulvalene; 2-[(7-{4-[N,N-bis(4-methylphenyl)amino]phenyl}-2,1,3-benzothiadiazol-4-yl) methylene]propanedinitrile; 6,13-bis((triethylsilyl)ethynyl) pentacene; 6,13-bis(triisopropylsilylethynyl)pentacene; C8-BTBT; copper(II) phthalocyanine; coronene; DH-FTTF; dibenzotetrathiafulvalene; 5,5'-di(4-biphenylyl)-2,2'-bithiophene; 3,3'''-Didodecyl-2,2':5',2": 5",2'''-quaterthiophene; diF-TES-ADT; 5,5'-dihexyl-2,2'-bithiophene; 3,3'''-dihexyl-2,2':5',2":5",2'''-quaterthiophene; 5,5''''-dihexyl-2,2': 5',2": 5",2''':5''', 2'''': 5'''', 2'''''-sexithiophene; dinaphtho[2,3-b:2', 3'-f]thieno[3,2-b]thiophene; 2-[7-(4-diphenylaminophenyl)-2,1,3-benzothiadiazol-4-yl]methylenepropanedinitrile; 2,6-diphenylbenzo[1,2-b:4,5-b]dithiophene sublimed grade; 2,7-diphenyl[1]benzothieno[3,2-b][1]benzothiophene sublimed grade; 6,13-diphenylpentacene; 2-{[7-(5-N,N-ditolylaminothiophen-2-yl)-2,1,3-benzothiadiazol-4-yl] methylene}malononitrile; 2,6-ditolylbenzo[1,2-b:4,5-b] dithiophene; DTS(FBTTh$_2$)$_2$; DTS(PTTh$_2$)$_2$; FTTF; merocyanine dye, HB194; PDPP2T-TT-OD; pentacene; pentacene-N-sulfinyl-tert-butylcarbamate; platinum octaethylporphyrin; 2,2':5',2":5",2'''-quaterthiophene; rubrene; α-sexithiophene; SMDPPEH; SMDPPO; 13,6-N-sulfinylacetamidopentacene; TES-ADT; tetrathiafulvalene; tin(IV) 2,3-naphthalocyanine dichloride; and/or tris[4-(5-dicyanomethylidenemethyl-2-thienyl)phenyl]amine.

Polar Elastomer Dielectric

The dielectric layer 16 should be relatively thin, pinhole-free, and have a high dielectric constant for low voltage operation. The dielectric layer 16 can be made of any suitable polar elastomer. In general, it is desirable to use polar elastomers having high capacitances because they produce OFETs having both high gain and high transconductance. One group of polar elastomers having high capacitances are those that exhibit a double-layer capacitance effect under an applied gate voltage. It should be appreciated that polar elastomers that do not exhibit the double-layer capacitance effect can also be used depending on the application.

The polar elastomer can have any suitable static capacitance. In some embodiments, the polar elastomer has a capacitance of at least approximately 0.1 $\mu F/cm^2$ or at least approximately 0.2 $\mu F/cm^2$. In other embodiments, the polar elastomer has a capacitance of approximately 0.1 $\mu F/cm^2$ to approximately 0.5 $\mu F/cm^2$ or approximately 0.2 $\mu F/cm^2$ to approximately 0.4 $\mu F/cm^2$. As mentioned above, the higher capacitances are generally produced by the polar elastomers that exhibit a double-layer capacitance effect under an applied gate voltage.

The polar elastomer can be used to produce relatively thick dielectric layers that have high capacitances. Thick layers may be desirable in some applications to prevent voltage leakage through the dielectric layer. Unlike conventional dielectrics, where the capacitance decreases as the thickness of the dielectric layer increases, the polar elastomer has a high capacitance that is largely independent of thickness up to a certain thickness such as 2.5 µm.

In some embodiments, the polar elastomer is deposited as a layer that is at least approximately 300 nm thick, at least approximately 400 nm thick, at least approximately 500 nm thick, or at least approximately 600 nm thick. In other embodiments, the polar elastomer is no more than approximately 2.5 µm thick or no more than approximately 2.0 µm thick. In other embodiments, the polar elastomer is approximately 300 nm to approximately 2.5 µm thick or approximately 400 nm to approximately 2.0 µm thick. The dielectric layer can also have any of these thicknesses.

The polar elastomer can also exhibit relatively high levels of thermal stability, especially when formed as a dielectric layer on silicon, glass ceramic, or glass substrate. In some embodiments, the polar elastomer is thermally stable (as measured using the test described in Example 3) at temperatures of at least approximately 150° C., at least approximately 180° C., at least approximately 200° C., at least approximately 225° C., or at least approximately 250° C.

In some embodiments, the polar elastomer includes one or more fluoroelastomers. The fluoroelastomers can have any suitable physical properties. For example, the fluoroelastomer can have a fluorine percentage of approximately 65% to approximately 71%, a specific gravity of approximately 1.80 to approximately 2.0, a mooney viscosity of approximately 17 to approximately 80 (measured at 1+10@121° C.), a tensile strength of approximately 10 MPa to approximately 18 MPa, an elongation at break of approximately 170% to approximately 350%, a 100% modulus measurement of approximately 2.5 MPa to approximately 8.5 MPa, and hardness (Shore A) of approximately 70 to approximately 86.

Examples of suitable fluoroelastomers include di-polymers (e.g., vinylidene fluoride and hexafluoropropylene), terpolymers (e.g., vinylidene fluoride, hexafluoropropylene, and tetrafluoroethylene), perfluoroelastomers, and the like. One notable example of a fluoroelastomer is elastomeric poly(vinylidene fluoride-co-hexafluoropropylene) (e-PVDF-HFP). This material has the structure shown below and is capable of exhibiting the double-layer capacitance effect described above.

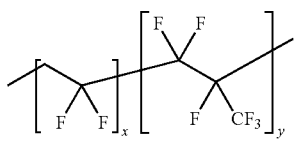

Suitable fluoroelastomers include any of 3M's Dyneon Fluoroelastomers. One example of a suitable e-PVDF-HFP is 3M's Dyneon Fluoroelastomer FC 2176 (fluorine content=65.9%; specific gravity=1.80; mooney viscosity=approximately 30; tensile strength=15.0; 100% modulus=4.1; elongation at break=240%; and hardness (shore A)=71). It is capable of producing a dielectric layer having a capacitance of approximately 0.3 $\mu F/cm^2$.

The polar elastomer can be crosslinked to make it more robust and chemically stable. This may be especially desirable for situations where the dielectric layer is later patterned using photolithography and the like. The polar elastomer can be crosslinked using crosslinking agents and/or by thermal curing at high temperatures (e.g., 180° C.). The surface of the polar elastomer can also be treated to alter its chemical and/or physical characteristics.

Various methods can be used to fabricate microstructures from the polar elastomer dielectric material. The methods can also be used to fabricate conducting electrodes. One method involves using a photoresist mask to pattern the polar elastomer dielectric layer. Another method involves using a metal mask to pattern the polar elastomer dielectric layer. Metal electrodes can also be patterned in various ways. Each of these methods is described in greater detail as follows.

Dielectric Layer Patterning Using a Photoresist Mask

Figure 2:
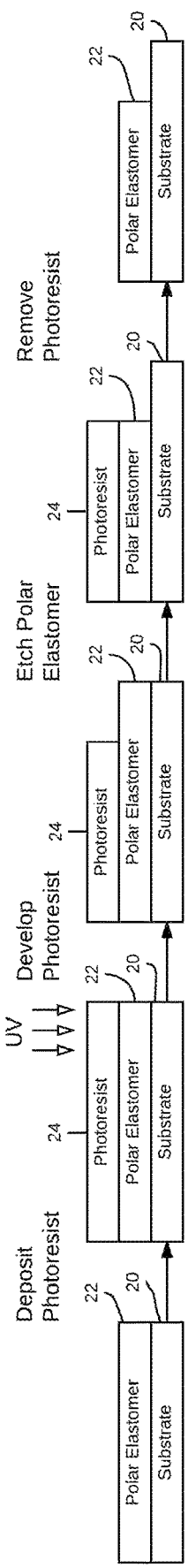
FIG. 2 shows a schematic process that can be used to pattern a polar elastomer dielectric layer using a photoresist mask.

FIG. 2 shows a schematic of one embodiment of a method that can be used to lithographically pattern a polar elastomer dielectric layer 22. The polar elastomer can be coated on a substrate 20 using any suitable method. Examples of suitable methods include any of those disclosed in the parent provisional patent application. In some embodiments, the substrate 20 is coated using a dynamic spin coating process or using a puddle spin coating process. Additional details about ways to coat the substrate 20 with the polar elastomer can be found in the parent provisional patent application.

The substrate 20 can be made of any suitable material and have any suitable configuration. For example, the substrate 20 can be made of silicon, ceramic glass, glass, organic semiconductor layer, electrode material, (these can be doped or undoped). The substrate 20 can be a single homogenous material or a combination of different materials organized in layers such as that shown in FIG. 1. The substrate can have numerous other configurations.

Referring to FIG. 2, a photoresist layer 24 is deposited on the polar elastomer layer 22. The photoresist layer 24 is made of a photoresist material, which is a light-sensitive material used to form a patterned coating on the surface of the polar elastomer layer 22. The photoresist layer 24 can include a positive photoresist, which is a type of photoresist where the portion that is exposed to light becomes soluble to the photoresist developer. The unexposed portion of the photoresist remains insoluble to the photoresist developer and forms the mask. The photoresist layer 24 can also be a negative photoresist, which is a type of photoresist where the portion that is exposed to light becomes insoluble to the photoresist developer. The unexposed portion of the photoresist is dissolved by the photoresist developer.

The photoresist layer 24 can be formed on the polar elastomer layer 22 in any of a number of suitable ways. In some embodiments, the photoresist material is dissolved in a solvent and spin coated on the polar elastomer layer 22. The photoresist and solvent should be selected to be compatible with the polar elastomer layer 22—i.e., not dissolve the polar elastomer layer 22 or significantly alter its physical characteristics. In some embodiments, a photoresist material and/or solvent are used that do not significantly interact with or dissolve the polar elastomer. This allows for the use of photoresists and/or solvents that interact with the polar elastomer but only if they do it slowly or in a way that doesn't significantly affect the function and/or structure of the polar elastomer layer 22.

The photoresist solution can also be applied in a way that minimizes contact with the polar elastomer layer 22. For example, the photoresist solution can be deposited at the center of the polar elastomer layer 22 while it is spinning so that the photoresist solution is rapidly spread out. One example of a suitable photoresist solution is FujiFilm HiPR 6512 (a positive photoresist dissolved in ethyl lactate). Other photoresist solutions can be used as well.

After the polar elastomer layer 22 has been coated with the photoresist solution, it is soft baked or dried to drive off the solvent. Soft bake temperatures are generally below the glass transition temperature of the photoresist to minimize and/or prevent crosslinking the photoresist but still remove the solvent. In contrast, hard bake temperatures are generally above the glass transition temperature of the photoresist. They are used to crosslink the photoresist to make it more robust and capable of withstanding harsh processing conditions. Intermediate temperatures between soft baking and hard baking can also be used to provide some level of hardening/crosslinking without fully hard baking the photoresist layer 24.

Soft bake and hard bake temperatures depend to some extent on the type of photoresist that is used. In some embodiments, the photoresist layer 24 is soft baked at a temperature of approximately 80° C. to approximately 105° C. In other embodiments, the photoresist is hard baked at a temperature of approximately 125° C. to approximately 165° C. The photoresist layer 24 can also be baked at an intermediate temperature that is approximately 105° C. to approximately 125° C. The photoresist layer 24 can be baked for any suitable amount of time such as, for example, at least approximately 2 minutes, at least approximately 3 minutes, or at least approximately 4 minutes.

The photoresist layer 24 is exposed to ultraviolet (UV) light through a photomask to define a pattern. The polar elastomer is generally insensitive to the UV exposure. After UV exposure, the photoresist layer 24 is developed using a photoresist developer. The photoresist developer removes the photoresist layer 24 in the areas exposed to UV light if the photoresist is positive or removes the photoresist in the areas not exposed to UV light if the photoresist is negative.

It should be appreciated that any suitable photoresist developer can be used to develop the photoresist layer 24.

Examples of suitable photoresist developers include tetramethylammonium hydroxide (TMAH), potassium hydroxide, and/or sodium hydroxide.

The photoresist layer 24 now forms a photoresist mask that can be used to etch the underlying polar elastomer layer 22. In some embodiments, it may be desirable to harden the photoresist layer 24 or otherwise make it more robust before etching. This may be done to increase the etching selectivity of the photoresist layer 24. This can be done by hard baking the photoresist layer 24. Additional processing of the photoresist layer 24 is strictly option but can be useful in situations where, for example, the polar elastomer layer 22 is dry etched.

The polar elastomer layer 22 is ready to be etched. It should be appreciated that any suitable method can be used to etch the polar elastomer layer 22. In general, the etching method should be capable of etching the polar elastomer layer 22 at a higher rate than the photoresist layer 24. Examples of suitable methods include plasma etching and/or reactive ion etching. One example of a particularly suitable etching method uses 15 mTorr oxygen plasma at 200 W and 40° C. to produce etching rates of 300 nm/min for the polar elastomer layer 22 and 180 nm/min for the photoresist layer 24 when it is hard baked.

For plasma etching, any suitable material can be used to form the plasma including oxygen, tetrafluoromethane ($CF_4$), fluoroform ($CHF_3$), mixtures of these, and the like. Noble gases such as argon and the like can also be added to the plasma to provide physical removal of any residual material that may be left on the surface.

The photoresist layer 24 is completely removed to leave the patterned polar elastomer layer 22. The photoresist layer 24 can be removed using any suitable method and/or material. In some embodiments, the photoresist layered 24 is removed using a photoresist stripping material. Examples of a suitable photoresist stripping material include highly acidic solutions such as that available from KMG Chemicals, Inc. under the name NANO-STRIP ((90%) Sulfuric acid and (5%) Peroxymonosulfuric acid). Highly acidic stripping solutions may be especially suitable for removing hard baked photoresist material. These stripping solutions can also leave the surface of the polar elastomer layer 22 extremely clean and smooth.

In some other embodiments, the photoresist layer 24 can be completely removed by flood exposure to UV radiation. The amount of UV radiation is typically much higher than that used for patterning. After UV exposure, the photoresist layer 24 is removed using a photoresist developer such as any of those described above. This method is generally more suitable for photoresist that has not been hard baked or crosslinked.

It should be noted that some materials that are commonly used to remove photoresist after processing may be incompatible with certain polar elastomers. For example, acetone, N-methyl-2-pyrrolidone (NMP), and/or propylene glycol methyl ether acetate (PGMEA) were found to be incompatible with the e-PVDF-HFP polar elastomer. It should be appreciated that these materials could potentially be used with other polar elastomers.

Conducting Structure Patterning

Figure 3:
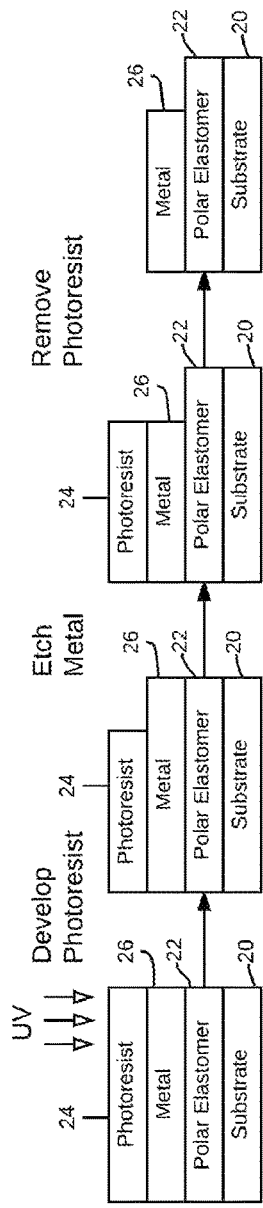
FIG. 3 shows a schematic process that can be used to pattern a polar elastomer dielectric layer using a metal mask.

FIG. 3 shows a schematic of one embodiment of a method that can be used to lithographically pattern conducting structures on top of the polar elastomer dielectric layer 22. The substrate 20 and the polar elastomer layer 22 can be made of the same materials and/or prepared using the same methods described above in connection with FIG. 2. The conducting structures can be used to form the source contact, drain contact, or gate electrode. Also, the conducting structure can be patterned without the use of shadow masks. The conducting structure is shown as a metal layer 26 in FIG. 3, but it should be appreciated that it can take other forms and be made of other materials.

The metal layer 26 can be deposited on the polar elastomer layer 22 using any suitable method such as electron beam physical vapor deposition and/or sputtering. The metal layer 26 can be made of any suitable metal capable of adhering to the polar elastomer layer 22. Examples of suitable metals include transition metals such as chromium, transition metal oxides such as indium tin oxide, and transition metal alloys. Although any of these metals can be used, aluminum, copper and noble metals are less preferred because they do not adhere as well to the polar elastomer layer 22 as well as other metals such as chromium.

The metal layer 26 can have any suitable thickness. In some embodiments, the metal layer 26 is at least approximately 30 nm thick, at least approximately 50 nm thick, or at least approximately 70 nm thick. In other embodiments, the metal layer 26 is no more than approximately 300 nm thick, no more than approximately 250 nm thick, or no more than approximately 200 nm thick. In yet other embodiments, the metal later 26 is approximately 30 nm to approximately 300 nm thick or approximately 50 nm to approximately 250 nm thick.

The metal layer 26 is coated with photoresist material to form the photoresist layer 24. This can be done using the methods and procedures described above in the context of applying the photoresist to the polar elastomer layer 22. In some embodiments, it may be desirable to increase the adhesion of the photoresist layer 24 to the metal layer 26. This can be accomplished by baking the photoresist material at an intermediate temperature that is higher than soft bake temperatures but lower than the glass transition temperature associated with hard baking. Subsequent processing should avoid heating the photoresist to a temperature above this temperature.

It should be appreciated that the photoresist layer 24 can be processed in any of the ways described above including soft baking, hard baking or other thermal processing. In general, the photoresist layer 24 can also be deposited, patterned, developed, and/or removed in any of the ways described above.

After the photoresist layer 24 has been developed, the metal layer 26 is etched to remove the metal in the exposed areas. It should be appreciated that any suitable etchant can be used to remove the metal. Examples of suitable etchants include aqueous solutions containing nitric acid, cerium ammonium nitrate, hydrofluoric acid, phosphoric acid, acetic acid, ammonium peroxydisulfate, hydrochloric acid, mixtures of these, and the like.

After etching the metal layer 26, the photoresist layer 24 is completely removed. Any residual photoresist can be removed using a stripping solution (e.g., NANO-STRIP) provided that the exposure time is short enough that the metal structures are not significantly etched. The use of a stripping solution is typically, but not always, used when there are no exposed organic materials.

Photoresist residue can also be removed using a brief low power oxygen plasma descum although if any polar elastomer is exposed it could be etched forming a step structure between the polar elastomer underneath the metal contacts and the exposed polar elastomer. Some transition metals such as chromium and molybdenum and noble metals except silver are not significantly attacked by acidic stripping solutions such as NANO-STRIP. Metals such as titanium and nickel are attacked but at a significantly slower rate compared to the organic photoresist residue.

Figure 4:
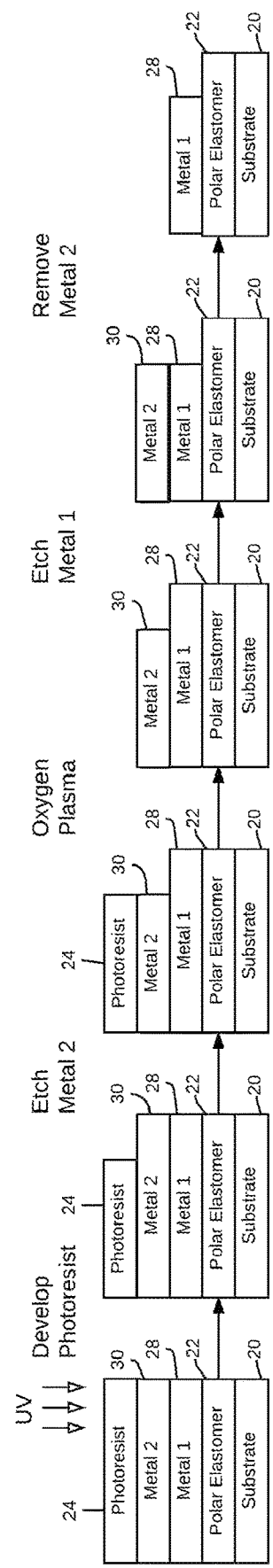
FIG. 4 shows a schematic process that can be used to pattern a metal layer positioned on a polar elastomer dielectric layer.

FIG. 4 shows a schematic of another embodiment of a method that can be used to lithographically pattern conducting structures on top of the polar elastomer dielectric layer 22. This embodiment is similar to that shown in FIG. 3 except two metal layers 28, 30 are deposited on the polar elastomer layer 22 instead of the single metal layer 26. The metal layers 28, 30 can be deposited using the same methods described for depositing the metal layer 26 such as electron beam physical vapor deposition and/or sputtering. The same method can be used to deposit both metal layers 28, 30 or different methods can be used to deposit each layer 28, 30.

The metal layers 28, 30 can be made of any suitable metals. In some embodiments, the metal in layers 28, 30 are dissimilar so that the metal in layer 30 can be selectively etched using an etchant solution that will not attack or will only slowly etch the metal in layer 28. This makes it possible to etch the metal layer 30 without significantly etching the metal layer 28. Examples of metal pairs that have different etching rates include, but are not limited to: (Cr, Ti), (Cr, Mo), (Cr, Cu), (Cr, Al), (Ti, Cr), (Ti, Al), (Ni, Al), (Ni, Ti), (Ni, Cu), (Ni, Cr), (Mo, Ti), or (Mo, Cr). In some embodiments, the metal layers 28, 30 can be made of the same metal. Conceptually, this is the same as having a single metal layer although it is somewhat thicker than a single layer so that it can be etched into a step shape as shown in FIG. 4.

The photoresist layer 24 is deposited, patterned, and developed using any of the methods described above. The exposed areas of the metal layer 30 are etched using any suitable metal etchant. If the metal in the layers 28, 30 are dissimilar from each other, then a metal etchant should be used that selectively etches the metal in the layer 30 compared to that in the layer 28. If, however, the metal in the layers 28, 30 are the same, then the etch time should be controlled so that only the metal in the layer 30 is removed.

The photoresist layer 24 can be removed using any of the techniques described above. In addition, the photoresist layer 24 can also be removed using oxygen plasma because the polar elastomer layer 22 is protected by the metal layer 28 so it will not be etched. The exposed areas of the metal layer 28 can be etched using any suitable metal etchant. The metal etchant should be capable of removing the metal in the layer 28 without significantly affecting the polar elastomer layer 22. The final step is to remove the metal layer 30 using any suitable metal etchant to expose the patterned structures of the metal layer 28.

Dielectric Layer Patterning Using a Metal Mask

A metal hard mask can also be used to pattern the underlying polar elastomer 22. This may be useful when the polar elastomer layer 22 is deposited on a layer or stack of layers that are incompatible with the materials used to remove the photoresist layer 24 after patterning. For example, this may occur when the polar elastomer layer 22 is deposited on certain organic semiconductor layers.

The hard mask can be created using any of the methods shown in FIGS. 3-4. After the metal layers have been patterned, the sample can be etched to remove the exposed areas of the polar elastomer layer 22. It should be appreciated that any suitable etching method can be used to accomplish this. For example, in one embodiment, oxygen plasma can be used to remove the exposed areas of the polar elastomer layer 22. The metal mask can be left in place if the metal is a structural component of the device (source, drain, gate electrode) or it can be removed using any of the methods and materials disclosed in this document.

The methods described above may be used in various advantageous ways. For example, the methods may be used to fabricate spatially isolated thin film transistor structures and gate dielectrics. They can also be used to make vias in the polar elastomer dielectric layer to access electrically conductive contacts underneath.

The methods may also be compatible with current manufacturing infrastructure and techniques. For example, the methods can be implemented using proven photoresist masking techniques and materials. The methods allow the polar elastomer material to be integrated into the existing thin film electronics manufacturing infrastructure. The polar elastomer dielectric can be patterned, etched, and stripped using proven and readily available materials.

The methods may also be used to manufacture double gate OTFTs and fabricate devices having a footprint down to 0.5 µm. They also demonstrate that the polar elastomer is immune to parasitic UV radiation exposure and atmospheric humidity. Moreover, they show that the polar elastomer films do not intermix with positive photoresist.

EXAMPLES

The following examples are provided to further illustrate the disclosed subject matter. They should not be used to constrict or limit the scope of the claims in any way.

Example 1

A polar elastomer dielectric was patterned using photoresist by following the general procedure shown in FIG. 2. A 150 mm silicon wafer 202 was coated with an e-PVDF-HFP layer 204 (3M Dyneon Fluoroelastomer FC 2176) using the dynamic deposition procedure described in the parent provisional patent application. The e-PVDF-HFP layer 204 was coated with a photoresist layer 206 using a spin coating process. The photoresist solution (FujiFilm HiPR 6512—a positive photoresist dissolved in ethyl lactate) was dispensed onto the e-PVDF-HFP layer 204 while it was spinning to minimize contact between the solvent in the photoresist solution and the e-PVDF-HFP.

After it was deposited, the photoresist layer 206 was baked at 115° C. for 5 minutes and then exposed to ultraviolet light through a photomask to define a pattern. The e-PVDF-HFP was determined to be insensitive to ultraviolet light exposure. The photoresist was developed using tetramethylammonium hydroxide (TMAH) to remove the photoresist areas exposed to ultraviolet light. The patterned photoresist layer 206 was hard baked (heated to a temperature above its glass transition temperature) at 140° C. for 1 minute to crosslink the photoresist and increase its subsequent etching sensitivity.

Figure 5:
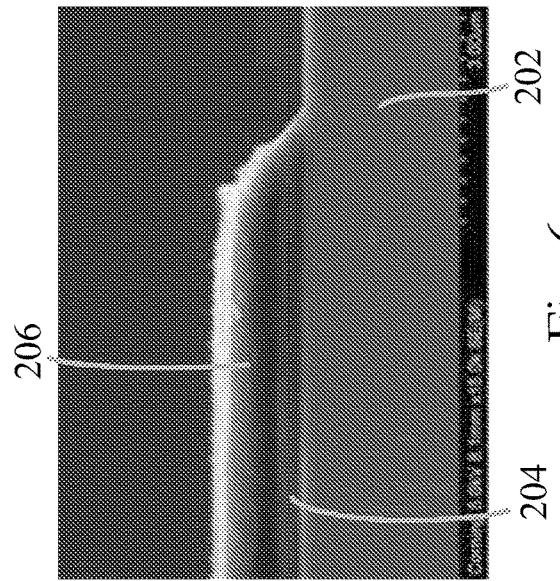
FIGS. 5-6 are SEM images of a cross-section of a silicon wafer coated with a polar elastomer (e-PVDF-HFP) that was etched using a photoresist mask.
Figure 6:
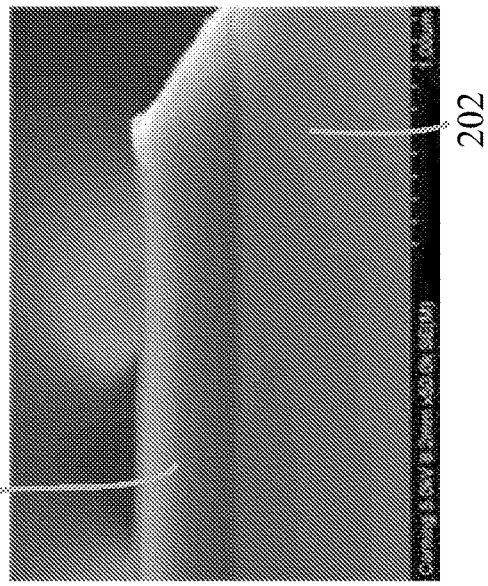

The e-PVDF-HFP layer 204 was dry etched using a plasma/reactive-ion etching (REI) tool using 15 mTorr oxygen plasma at 200 W and 40° C. This etched the e-PVDF-HFP at a rate of approximately 300 nm/min while only etching the photoresist at a rate of approximately 180 nm/min. FIGS. 5-6 are scanning electron microscope (SEM) images of a cross-section of the silicon wafer 202 after the e-PVDF-HFP layer 204 was etched. The images show a clean, well-defined interface between the e-PVDF-HFP layer 204 and the photoresist layer 206.

Figure 7:
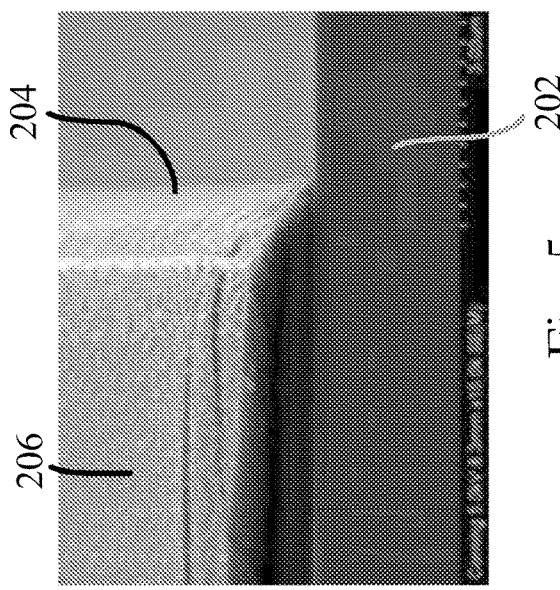
FIGS. 7-8 are SEM images of the silicon wafer in FIGS. 5-6 after the photoresist was removed.
Figure 8:
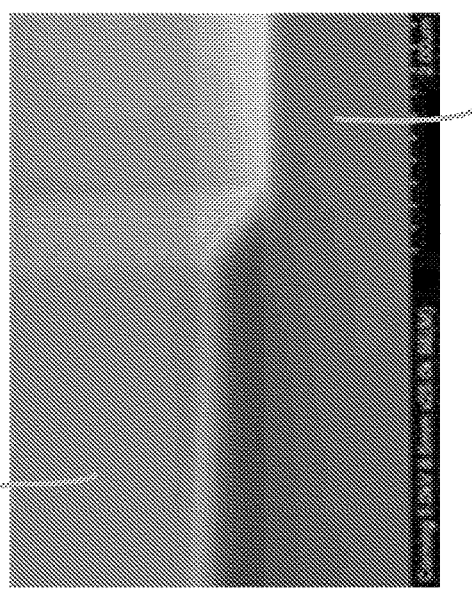

The photoresist layer 206 was completely removed using NANO-STRIP (90 wt % sulfuric acid, 5 wt % peroxymonosulfuric acid, <1 wt % hydrogen peroxide, 5 wt % water). FIGS. 7-8 are SEM images of the cross-section of the silicon wafer 202 showing the patterned e-PVDF-HFP layer 204.

The top surface of the e-PVDF-HFP layer 204 was clean which indicates that the photoresist 206 was fully removed and did not impact the morphology of the e-PVDF-HFP layer 204.

Example 2

A polar elastomer dielectric was patterned using a metal mask by following the general procedure shown in FIG. 3. A 150 mm silicon wafer 202 was coated with an e-PVDF-HFP layer 204 using the procedure described in Example 1. The e-PVDF-HFP layer 204 was coated with an 80 nm thick chromium layer 208 using an electron beam physical vapor deposition process. The chromium layer 208 was coated with photoresist using the same procedure described in Example 1 to produce the photoresist layer 206.

The photoresist layer 206 was baked at 115° C. for 5 minutes to drive off the solvent and then exposed to ultraviolet light through a photomask to define a pattern. The photoresist was developed using tetramethylammonium hydroxide (TMAH) to remove the photoresist areas exposed to ultraviolet light. The patterned photoresist layer 206 was not further hard baked to avoid crosslinking although it was baked at a temperature higher than that used for typical soft baking.

An aqueous metal etchant (Transene Chroumium Etchant 1020: 4-6 wt % of Nitric Acid, 10-20 wt % Ceric Ammonium Nitrate, 74-86 wt % Water) was used to remove the chromium layer 208 in the areas not covered by photoresist. The photoresist layer 206 was completely removed by flood exposure to ultraviolet radiation at levels significantly higher than that normally used for patterning followed by immersion in TMAH photoresist developer.

The e-PVDF-HFP layer 204 was dry etched using the procedure described in Example 1. FIGS. 9-10 are SEM images of a cross-section of the sample after it was etched. They show that the chromium mask layer 208 was not etched by the oxygen plasma although the surface was roughened. The images also show that the chromium mask layer 208 can be used to achieve a vertical profile for the e-PVDF-HFP layer 204. FIGS. 15-16 are SEM images of chromium microstructures 216 formed on the surface of the e-PVDF-HFP layer 204. They show that large metal structures were free of photoresist residue but smaller metal structures were not.

Example 3

A polar elastomer dielectric was patterned using the procedure described in Example 2 except the substrate was alkaline earth boro-aluminosilicate glass (Corning Eagle XG Slim Glass) 210 coated with nickel 212. FIGS. 11-12 are SEM images of a cross-section of the sample after it was etched. They show that the chromium mask layer 208 produces well defined vertical profiles in the e-PVDF-HFP layer 204. Also, the e-PVDF-HFP layer 204 has no problem adhering to the underlying nickel coating 212 (or any of the other metal layers).

Example 4

A polar elastomer dielectric was patterned using the procedure described in Example 2 except the substrate was alkaline earth boro-aluminosilicate glass (Corning Eagle XG Slim Glass) 210 coated with chromium 214 and the dry plasma etch used tetrafluoromethane ($CF_4$) instead of oxygen. The etch rate using tetrafluoromethane was 207 nm/min. FIGS. 13-14 are SEM images of a cross-section of the sample after it was etched. They show that tetrafluoromethane roughens the surface significantly and does not clear out the exposed area efficiently. Although the tetrafluoromethane plasma did not perform as well as the oxygen plasma, it is postulated that one way to enhance physical removal of the material in the exposed area is by adding a noble gas such as argon.

Example 5

A polar elastomer dielectric is patterned using the procedure described in Example 2 except the photoresist is soft baked at 90° C. for 5 minutes. Baking at this temperature makes it easier to remove the remaining photoresist after patterning using UV flood exposure. Lowering the bake temperature in the absence of a hard bake also makes the photoresist less resistant as an etch mask especially in dry etching. However, this is not an issue because the photoresist is used to wet etch the chromium layer 208 and then removed leaving the chromium layer 208 as the dry etch mask.

Articles such as "the," "a," and "an" can connote the singular or plural. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

All disclosed numerical values are to be understood as being variable from 0-100% in either direction and thus provide support for claims that recite such values or any and all ranges or subranges that can be formed by such values. For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range (e.g., 15.2).

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

The subject matter recited in the claims is not coextensive with and should not be interpreted to be coextensive with any embodiment, feature, or combination of features described or illustrated in this document. This is true even if only a single embodiment of the feature or combination of features is illustrated and described.

What is claimed is:

1. A method of fabricating microstructures of polar elastomers, comprising:
    coating a substrate with a dielectric material comprising a polar elastomer;
    coating the dielectric material with a photoresist;
    exposing the photoresist to ultraviolet (UV) light through a photomask to define a pattern on the photoresist;
    developing the photoresist to form the pattern on the photoresist;
    etching the dielectric material to transfer the pattern from the photoresist to the dielectric material; and
    treating the patterned dieletric material with a highly acidic solution to remove the photoresist from the patterned dielectric material.

2. The method of claim 1, further comprising:
    hard-baking the photoresist after developing the photoresist and before etching dielectric material.

3. The method of claim 1, comprising maintaining the photoresist at a temperature below the glass transition temperature of the photoresist throughout the process.

4. The method of claim 1, comprising maintaining the substrate, the dielectric material, and the photoresist at a temperature below 200° C. throughout the process.

5. The method of claim 1, comprising maintaining the photoresist at a temperature below approximately 125° C. throughout the process.

6. The method of claim 1, wherein the etching comprises: dry-etching the dielectric material using at least one of a plasma or a reactive ion etching tool.

7. The method of claim 1, wherein the polar elastomer comprises a fluoroelastomer.

8. The method of claim 7, wherein the polar elastomer comprises poly(vinylidene fluoride-co-hexafluoropropylene)(e-PVDF-HFP).

9. The method of claim 7, wherein the polar elastomer has double-layer capacitance properties.

10. The method of claim 1, wherein the highly acidic solution comprises sulfuric acid.

* * * * *

UNITED STATES PATENT AND TRADEMARK OFFICE
CERTIFICATE OF CORRECTION

PATENT NO. : 11,329,228 B2
APPLICATION NO. : 16/471446
DATED : May 10, 2022
INVENTOR(S) : Robert George Manley et al.

Page 1 of 1

It is certified that error appears in the above-identified patent and that said Letters Patent is hereby corrected as shown below:

On the Title Page

In item (56), in Column 2, under "Other Publications", Line 6, delete "Nanotechnoloyg;" and insert -- Nanotechnology; --.

On the page 2, in item (56), in Column 2, under "Other Publications", Line 11, delete "Diketopyrrolopyrrol" and insert -- Diketopyrrolopyrrole --.

On the page 2, in item (56), in Column 2, under "Other Publications", Line 15, delete "Execeptionally" and insert -- Exceptionally --.

In the Claims

In Column 16, Line 8, in Claim 1, delete "dieletric" and insert -- dielectric --.

In Column 16, Lines 30-31 (Approx.), in Claim 8, delete "hexafluoropropylene)(e-PVDF-HFP)." and insert -- hexafluoropropylene) (e-PVDF-HFP). --.

Signed and Sealed this
Twenty-seventh Day of September, 2022

Katherine Kelly Vidal
*Director of the United States Patent and Trademark Office*